United States Patent

Kuraishi et al.

[11] Patent Number: 5,859,471
[45] Date of Patent: Jan. 12, 1999

[54] SEMICONDUCTOR DEVICE HAVING TAB TAPE LEAD FRAME WITH REINFORCED OUTER LEADS

[75] Inventors: Fumio Kuraishi; Kazuhito Yumoto; Mamoru Hayashi, all of Nagano, Japan

[73] Assignee: Shinko Electric Industries Co., Ltd., Nagano, Japan

[21] Appl. No.: 948,029

[22] Filed: Oct. 9, 1997

Related U.S. Application Data

[63] Continuation of Ser. No. 256,531, filed as PCT/JP03/01677, Nov. 16, 1993, published as WO94/11902, May 26, 1994, abandoned.

[30] Foreign Application Priority Data

Nov. 17, 1992 [JP] Japan ..................................... 4-332531
Mar. 23, 1993 [JP] Japan ..................................... 5-63738

[51] Int. Cl.⁶ ................................................. H01L 23/495
[52] U.S. Cl. .......................... 257/666; 257/668; 257/670; 257/671
[58] Field of Search ..................................... 252/666, 668, 252/670, 671, 690, 734, 736, 750, 762, 767

[56] References Cited

U.S. PATENT DOCUMENTS 4,707,724  11/1987  Suzuki et al. ............................ 257/666
5,311,056  5/1994   Wakabayashi et al. ................. 257/670

FOREIGN PATENT DOCUMENTS 315 947  5/1994  Austria .

OTHER PUBLICATIONS

*Microelectronics Packaging Handbook*, (Ed. Tummala and Rymaszewski), 1988, pp. 414–415.

Shibata et al., "Film Carrier Tape," *Patent Abstracts of Japan*, vol. 12, No. 49 (E–582) 13 Feb. 1988 & JP–A–62 196840 (Oki Electric IND CO LTD) 31 Aug. 1987.

Mizukami et al., "Electronics Device," *Patent Abstracts of Japan*, vol. 13, No. 44 (E–710) 31 Jan. 1989 & JP–A–63 293829 (Hitachi LTD) 5 Oct. 1988.

Saigo et al., "Leadframe and Its Manufacture," *Patent Abstracts of Japan*, vol. 14, No. 576 (E–1016) 21 Dec. 1990 & JP–A–02 250364 (TOPPAN Printing CO LTD) 8 Oct. 1990.

Yumoto et al., "Manufacture of Tab Tape," *Patents Abstracts of Japan*, vol. 16, No. 340 (E–1238) 3 Apr. 1992 & JP–A–04 102341 (Shinko Electric CO LTD) 3 Apr. 1992.

*Primary Examiner*—Carl W. Whitehead, Jr.

[57] ABSTRACT

In a lead frame adapted to be used for a semiconductor device, a plurality of inner leads are made of a thin conductive material for easily forming a fine pattern of the inner leads. A plurality of outer leads are integrally formed with the respective inner leads. The outer leads are coated with metal layers to increase the thickness thereof, so that a desired strength of the outer leads is obtained. A semiconductor chip is electrically connected to the inner leads. The semiconductor chip and a part of the lead frame including the inner leads are hermetically sealed with a resin and, thus, a semiconductor device is obtained.

15 Claims, 12 Drawing Sheets

SEMICONDUCTOR DEVICE HAVING TAB TAPE LEAD FRAME WITH REINFORCED OUTER LEADS

This application is a continuation of application Ser. No. 08/256,531, filed as PCT/JP93/01677 Nov. 16, 1993 published as WO94/11902 May 26, 1994, now abandoned.

TECHNICAL FIELD

The present invention relates to a lead frame and a semiconductor device using the same lead frame. This invention also relates to a process for making such a lead frame.

BACKGROUND ART

In the field of lead frames adapted to be used for a semiconductor device, since semiconductor chips have become highly integrated, multi-pin lead frames having a large number of leads and a fine lead pattern structure have been developed and produced. In this connection, in order to make a fine lead pattern structure on a lead frame, a relatively thin material has been used as a lead frame base and an etching process has been widely adopted to form such fine micro-patterns, since the etching process is more suitable than other processes, such as a punching process, to easily form such fine patterns.

In a conventional method for manufacturing a lead frame, however, there has been a limitation on forming a very fine lead pattern. Thus, a TAB (tape automated bonding) tape lead frame has been developed and used, on which a finer pattern could be formed than on a conventional metal lead frame.

A TAB tape can be made by forming a thin conductive film on an electrically insulative base film and etching the conductive film to form a desired conductive pattern. Using such a TAB tape, since the conductive patterns are supported on a thin flexible base film, the thickness of such conductive patterns can be reduced to about several tens of $\mu$m. Thus, it becomes possible to make very fine patterns of leads which could not be attained on a conventional metal lead frame.

On the other hand, a semiconductor device is conventionally made as follows. After the inner leads of the lead frame are electrically connected to the semiconductor chip by a wire-bonding process, the lead frame is hermetically sealed with resin to obtain a product. In a case where a TAB tape is used, the lead frame is also hermetically sealed with resin to obtain a semiconductor device product.

However, as mentioned above, since a TAB tape includes a plurality of leads which are made of conductive thin film, there has been a problem that the leads are not of sufficient strength and it is difficult to handle same, such as when the product is mounted on a printed circuit board.

The above-mentioned problems concerning a TAB-tape also arise when a so-called single-layer-type TAB tape is used to make a lead frame, in which the leads are formed of a very thin conductive material with a thickness of not more than 100 $\mu$m.

In addition, after the leads have been formed, it is necessary to prevent the leads from being deformed or bent. Thus, it becomes necessary that the outer leads have a certain strength to stably and accurately mount the product on a printed circuit board without any deformation of the leads.

DISCLOSURE OF INVENTION

An object of the present invention is to provide a lead frame and a semiconductor device using the same lead frame, in which the lead frame can be easily handled, as if it were a lead frame using a TAB tape or other thin material, so that a semiconductor device product using such a lead frame can easily be mounted on a printed circuit board.

According to one aspect of the present invention, there is provided a lead frame adapted to be used for a semiconductor device comprising a plurality of inner leads made of a thin conductive material for easily forming a fine pattern of said inner leads and a plurality of outer leads integrally formed with said respective inner leads, said outer leads being coated with metal layers to increase the thickness thereof, so that a desired strength of said outer leads is obtained.

According to another aspect of the present invention, there is provided a lead frame adapted to be used for a semiconductor device comprising an insulating base film; a conductive pattern formed on said insulating base film, said conductive pattern including a plurality of inner leads and a plurality of outer leads integrally formed with said respective inner leads; and said inner leads being relatively thin, but said outer leads being coated with metal layers to increase the thickness thereof, so that a desired strength of said outer leads is obtained.

According to still another aspect of the present invention, there is provided a process for making a lead frame adapted to be used for a semiconductor device and comprising the steps of forming a conductive layer on an insulating base film; etching said conductive layer to form a conductive pattern including a plurality of inner leads and a plurality of outer leads integrally formed with said respective inner leads; and coating said outer leads with metal layers to increase the thickness of said outer leads, so that a desired strength of said outer leads is obtained.

According to further aspect of the present invention, there is provided a process for making a lead frame adapted to be used for a semiconductor device and comprising the steps of forming a conductive layer on an insulating base film having a device hole at a central position thereof and window holes located apart from said central device hole; etching said conductive layer to form a conductive pattern including a plurality of inner leads and a plurality of outer leads integrally formed with said respective inner leads, so that each said inner lead extends inward into said central device hole and each said outer lead extends outward from said inner lead over said window hole; and coating said outer leads with metal layers to increase the thickness thereof, so that a desired strength of said outer leads is obtained.

According to still further aspect of the present invention, there is provided a process for making a lead frame adapted to be used for a semiconductor device comprising the steps of forming a conductive layer on an insulating base film having window holes located apart from a central position of said base film; etching said conductive layer to form a conductive pattern including a die-pad located at a central position of said insulating base film, a plurality of inner leads and a plurality of outer leads integrally formed with said respective inner leads, so that each said inner lead extends toward said die-pad and each said outer lead extends outward from said inner lead over said window hole; and coating said outer leads with metal layers to increase the thickness thereof, so that a desired strength of said outer leads is obtained.

According to still another aspect of the present invention, there is provided a semiconductor device comprising a lead frame adapted to be used for a semiconductor device and having a plurality of inner leads made of a thin conductive material for easily forming a fine pattern of said inner leads; and a plurality of outer leads integrally formed with said respective inner leads, said outer leads being coated with metal layers to increase the thickness thereof, so that a desired strength of said outer leads is obtained; a semiconductor chip electrically connected to said inner leads; and a resin for hermetically sealing said semiconductor chip and a part of said lead frame including said inner leads.

According to still another aspect of the present invention, there is provided a semiconductor device comprising a lead frame having an insulating base film with a device hole at a central position thereof and window holes located apart from said device hole; a conductive pattern formed on said insulating base film, said conductive pattern including a plurality of inner leads and a plurality of outer leads integrally formed with said respective inner leads, so that each said inner lead extends inward into said central device hole and each said outer lead extends outward from said inner lead over said window hole; and said inner leads being relatively thin, but said outer leads being coated with metal layers to increase the thickness thereof, so that a desired strength of said outer leads is obtained; a semiconductor chip mounted on and electrically connected to said inner leads within said central opening; and a resin for hermetically sealing said semiconductor chip and a part of said lead frame including said inner leads.

According to still another aspect of the present invention, there is provided a semiconductor device comprising a lead frame having an insulating base film with window holes located apart from a central position of said base film; a conductive pattern formed on said insulating base film, said conductive pattern including a plurality of inner leads and a plurality of outer leads integrally formed with said respective inner leads, so that each said inner lead extends toward said die-pad and each said outer lead extends outward from said inner lead over said window hole; and said inner leads being relatively thin, but said outer leads being coated with metal layers to increase the thickness thereof, so that a desired strength of said outer leads is obtained; a semiconductor chip mounted on said die-pad; bonding wires for electrically connecting said semiconductor chip to said inner leads; and a resin for hermetically sealing said semiconductor chip and a part of said lead frame including said inner leads.

BEST MODE FOR CARRYING OUT THE INVENTION

Figure 1A:
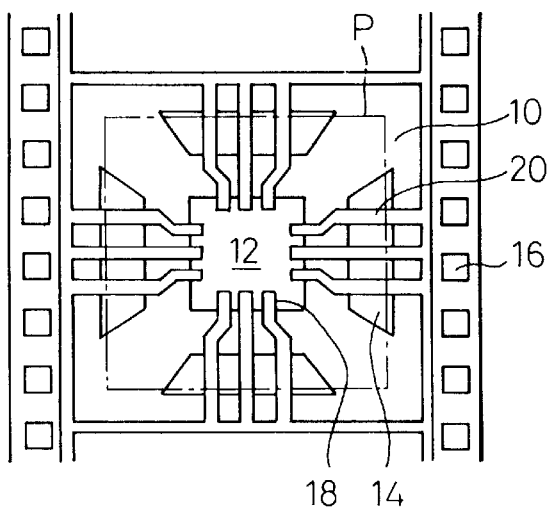
FIG. 1A–1D are plan views of some embodiments of a lead frame according to the present invention.

Referring now to the drawings, wherein FIGS. 1A–1D are plan views of embodiments of a lead frame constituted as a TAB tape according to the present invention. The TAB tape comprises an electrically insulating flexible base film 10, made of a material such as a polyimide, and an electrically conductive pattern formed on a surface of the base film. The conductive pattern having a desired pattern can be formed by any conventionally known method, such as by etching a conductive thin film attached on the base film 10. In order to attach a thin conductive film onto the base film, any known method can be used, such as a sputtering, vapor deposition, or adhering a copper foil onto the base film using any suitable adhesive.

Figure 1C:
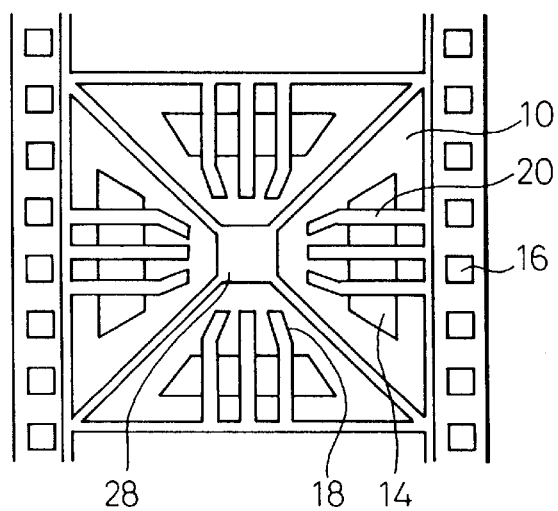
Figure 1B:
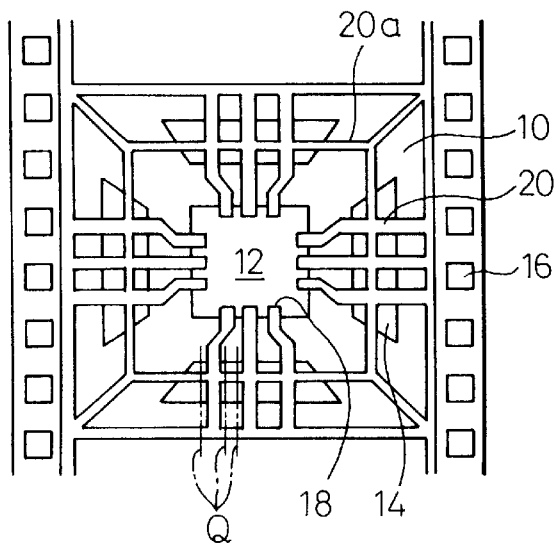

The base film 10 of the (inner lead bonding type) TAB tapes shown in FIGS. 1A and 1B is first provided with a device hole 12 at the central position of the TAB tape, four window holes 14 located apart from the device hole and symmetrically arranged to each other, and sprocket holes 16 equidistantly and regularly arranged at the edges of the TAB tape. A copper foil is then adhered to the base film 10 and etched to obtain a desired conductive pattern. The conductive pattern comprises inner leads 18 having the respective inner tips extending inwardly to the inside (i.e., interior) of the device hole 12 and the corresponding outer leads 20 extending outwardly from the respective inner leads 18 and over the window holes 14. The outer leads 20 are cut at the outer edge of the window holes 14, as shown by line P in FIG. 1A, after a semiconductor chip (not shown) is mounted on the TAB tape and hermetically sealed with resin (not shown).

Figure 1D:
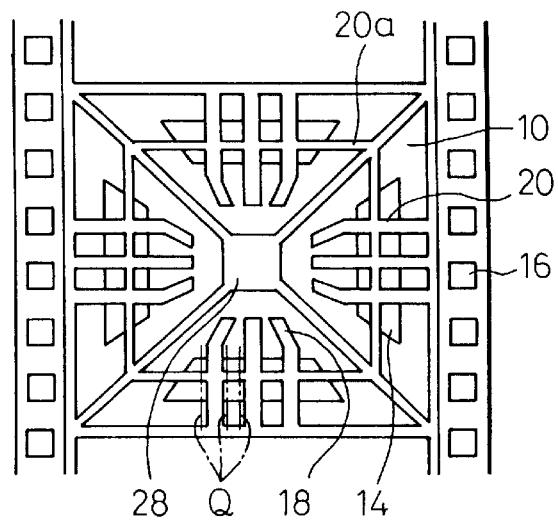

The (wire-bonding type) TAB tape shown in FIGS. 1C and 1D is substantially the same as the TAB tape shown in FIGS. 1A and 1B, except that the base film 10 has no central device hole, but a conductive die pad 28 is formed at the central position of the TAB tape. Such a conductive die pad 28 can be formed simultaneously with the conductive pattern comprising inner and outer leads 18 and 20.

The TAB tapes shown in FIGS. 1B and 1D are substantially the same as the TAB tapes shown in FIGS. 1A and 1C, respectively, except that a tie bar 20a is provided for continuously connecting the outer leads. Such a tie bar 20a can also be formed simultaneously with the conductive pattern comprising inner and outer leads 18 and 20. Also, these tie bars 20a are cut out to separate the adjacent outer leads 20 from each other, as shown by lines Q in FIGS. 1B and 1D, after a semiconductor chip (not shown) is mounted on the TAB tape and hermetically sealed with resin (not shown).

In FIGS. 2A–2D, semiconductor devices using lead frames of FIGS. 1A–1D, respectively, are shown. FIG. 3 is a cross-sectional view of the (inner lead bonding type) TAB tape semiconductor device of FIG. 2A or 2B. FIG. 4 is a cross-sectional view of the (wire-bonding type) semiconductor device of FIG. 2C or 2D.

In each of the above types of TAB tapes and accordance with the invention, the thickness of the conductive part of the outer lead is increased, in such a manner that the outer lead has a thickness substantially the same as the outer lead of a conventional metal lead frame. Consequently, in the embodiment of this invention, after the copper foil is adhered to the base film 10, the foil is etched to obtain a desired conductive pattern comprising inner leads 18 and the corresponding outer leads 20 and then a nickel layer is plated is plated on the patten, in the same manner as a conventional method. Then, a copper layer is further plated only on the outer lead portions 20 and so as to increase the thickness thereof. As the thickness of the outer leads 20 is increased, as shown in FIGS. 3 and 4, by the copper-plating, the strength can also be increased to substantially the same level as a conventional metal lead frame.

The width of the outer lead 20 can also be increased, as well as the thickness thereof, by the above-mentioned copper-plating. However, since the gaps between the adjacent outer leads 20 are much larger than the gaps between the adjacent inner leads 18, it is effective to plate the outer leads 20 with a copper layer to increase the thickness of the outer leads 20 to a certain value so as to increase the strength thereof.

In a typical TAB tape, in practice, where the thickness of the inner leads 18 (i.e., the thickness of the copper foil) is about 12–70 μm, the thickness of the outer leads 20 can be thus increased to about 125 μm.

As clearly shown in FIGS. 2A, 2B, 3 and 4, a rectangular or frame-shaped solder resist 22 is coated on the inner leads 18 at a position of the inner leads 18 corresponding to a clamp position of a mold (not shown) which is used, at a later stage, for hermetically sealing the semiconductor device with a resin 26, in such a manner that the gaps between the adjacent inner leads 18 are filled with the resist to prevent the sealing resin 26 from flowing out of the mold (not shown), during a molding process.

Figure 2A:
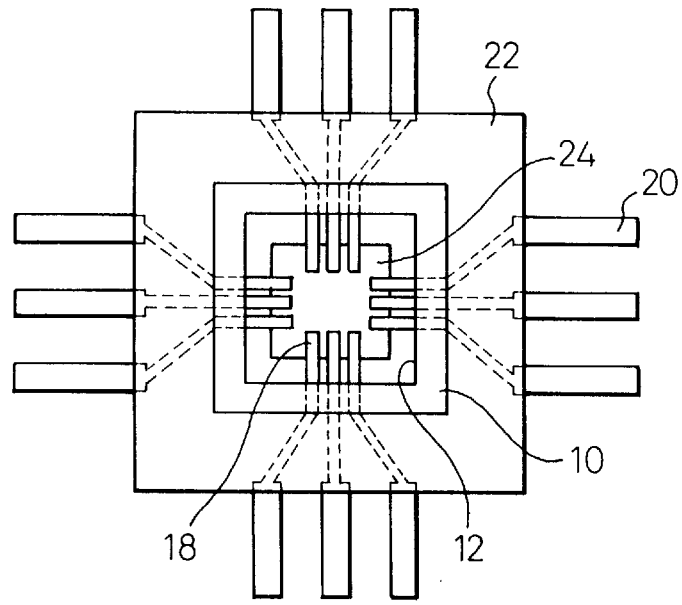
FIGS. 2A–2D are plan views of embodiments of a semiconductor device, using a lead frame shown in FIGS. 1A–1D, respectively, according to the present invention.
Figure 2B:
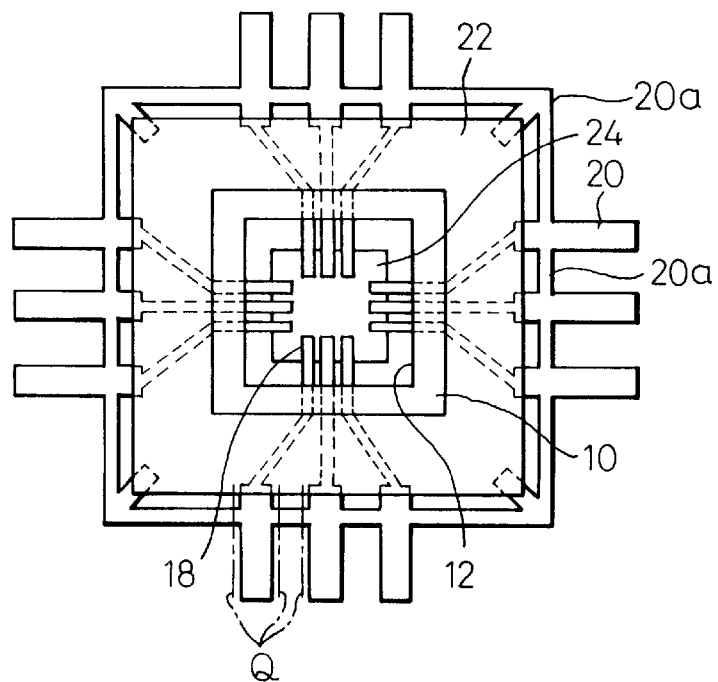
Figure 3:
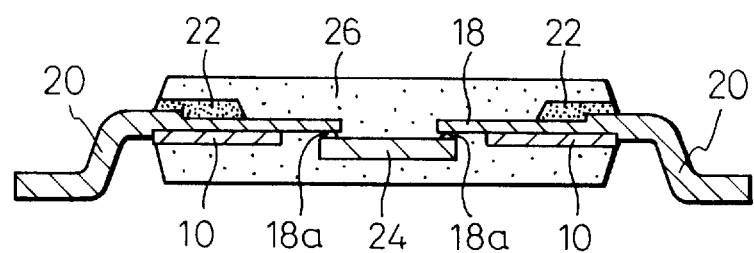
FIG. 3 is a cross-sectional view of a semiconductor e vice shown in FIG. 2A or 2B.
Figure 4:
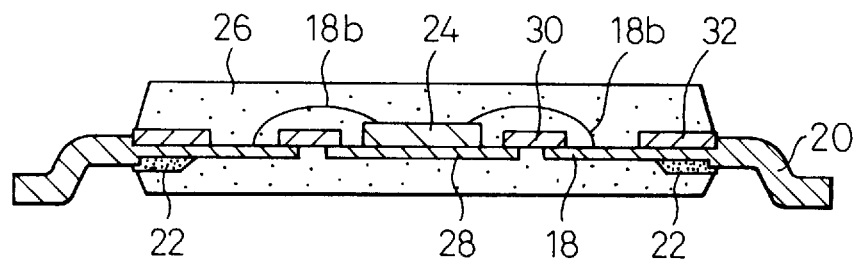
FIG. 4 is a cross-sectional view of a semiconductor device shown in FIG. 2C or 2D.

In the TAB tapes shown in FIGS. 2A, 2B and 3 (i.e., inner lead bonding type TAB tapes), the semiconductor chip 24 is mounted on the TAB tapes, in such a manner that the semiconductor chip 24 is connected to the inner leads 18 by a simultaneous bonding via bumps 18a provided on the surfaces of the semiconductor chip 24. Then, the TAB tape is clamped by the mold (not shown) in the direction of the thickness thereof between the base film 10 and the solder resist 22, and a resin 26 is then filled in the mold to obtain a hermetically sealed semiconductor device.

Figure 2C:
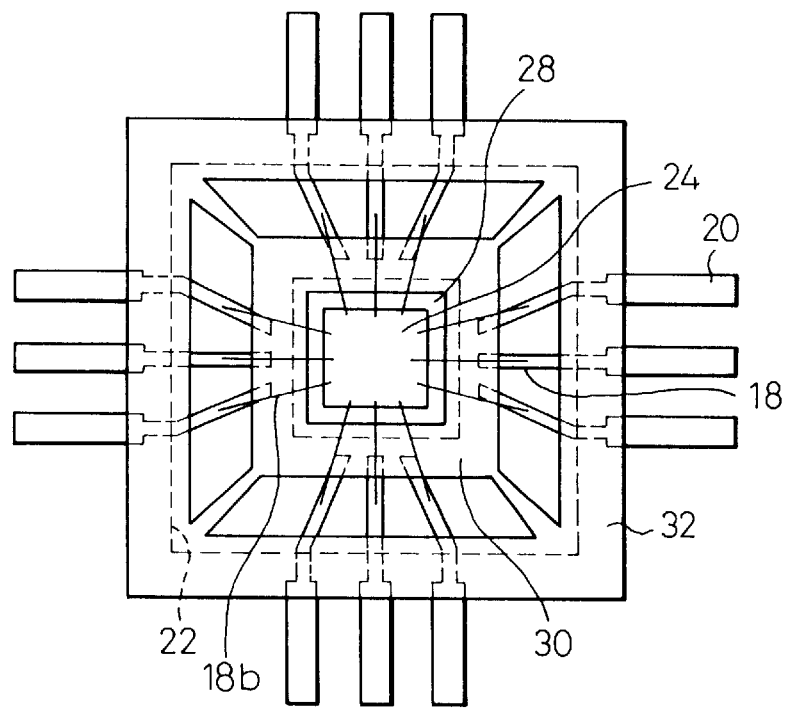
Figure 2D:
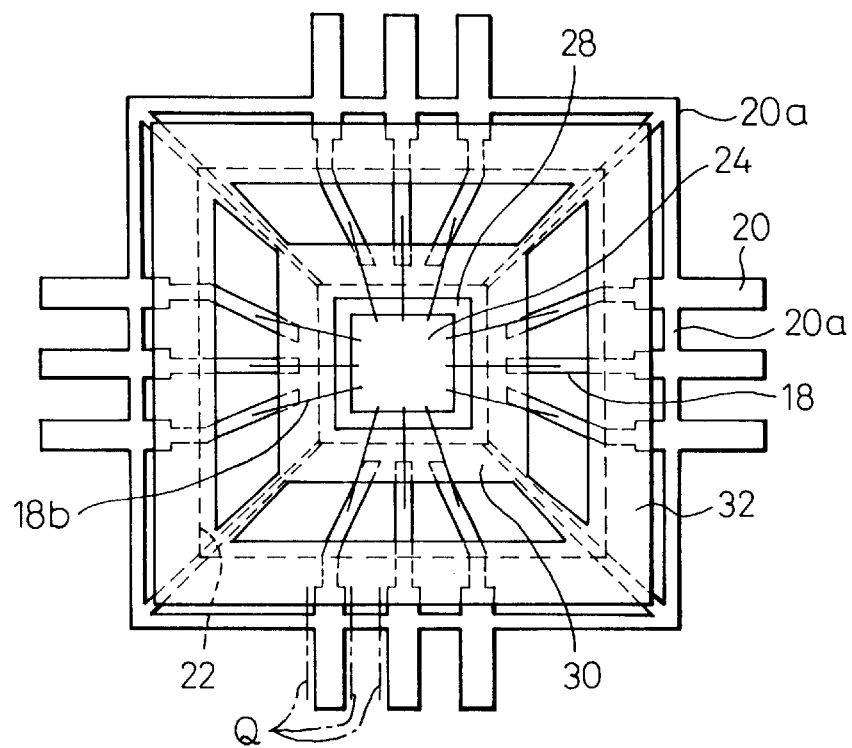

On the other hand, in the TAB tape shown in FIGS. 2C, 2D and 4, i.e., a wire-bonding type TAB tape, the die pad 28 and the inner leads 18 are mutually supported by the base film portion 30, which maintains the micro-pattern of inner leads 18 to prevent any movement thereof. A semiconductor chip 24 is mounted on the die pad 28 of the TAB tape and, then, the semiconductor chip 24 is connected to the inner leads 18 by bonding-wires 18b in a conventionally known wire-bonding process. In the same manner as the above, the solder resist 22 is coated against the base film portion 32, in such a manner that the gaps between the adjacent inner leads 18 are filled with the resist to prevent the sealing resin 26 from flowing out of the mold (not shown), during a molding process.

As shown in FIGS. 3 and 4, the thickness of the outer leads 20 is increased by copper-plating, so that the strength of the outer leads 20 is substantially the same as that of a conventional metal lead frame. Therefore, the outer lead portions 20 can easily be handled, and bent, so that the semiconductor device using such a lead frame of the embodiments can easily be mounted on a circuit board (not shown). Also, in the embodiments having a tie-bar 20a as shown in FIGS. 2B and 2D, such a tie-bar 20a can easily be removed along the line Q. On the other hand, the inner leads 18 have a thickness much smaller than that of the outer leads 20, so that a TAB tape having fine inner leads, suitable for a high-density semiconductor device, can thus be obtained.

The thickness of the outer leads 20 may be uneven, after the thickness thereof is increased by copper-plating. In that case, the outer leads 20 can be subjected to a coining or pressing process to obtain flat outer leads 20. When the thickness of the outer leads 20 is regulated by the coining or the like, the width thereof can be simultaneously regulated to obtain a desired width.

Figure 5A:
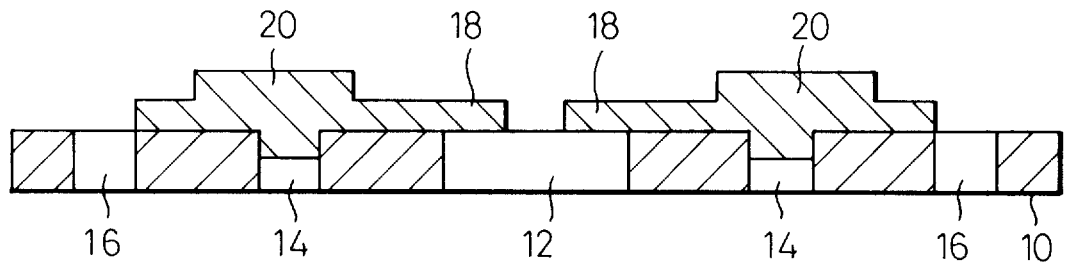
FIGS. 5A–5C are cross-sectional views of some variations of a lead frame according to the present invention.
Figure 5B:
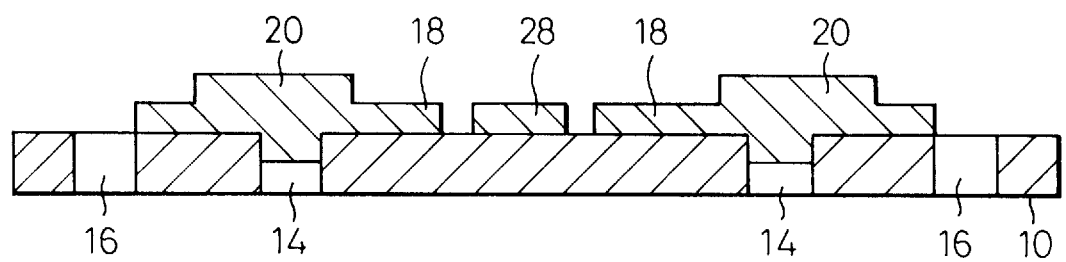
Figure 5C:
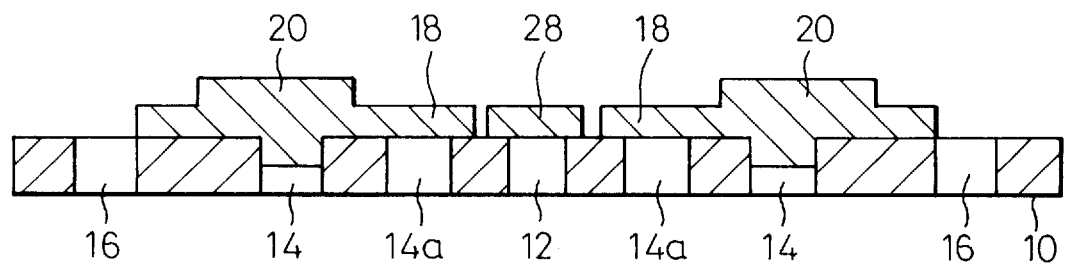

FIGS. 5A–5C are cross-sectional views of some variations of a TAB tape, i.e., a lead frame. An inner lead bonding type TAB tape of FIG. 5A corresponds to the TAB tape shown in FIG. 1A or 1B. A wire-bonding type TAB tape of FIG. 5B corresponds to the TAB tape shown in FIG. 1C or 1D. Another wire-bonding type TAB tape of FIG. 5C is the same as that of FIG. 5B, except that the TAB tape of FIG. 5C has a device hole 12 and second window holes 14a, so that, as shown in FIG. 7, a semiconductor chip 28 can be mounted on the lower surface of the die-pad 28 and the semiconductor chip 24 can be connected to the inner leads 18 by the bonding wires 18b through the second window holes 14a, which are provided between the central device hole 12 and the first window holes 14.

Figure 6A:
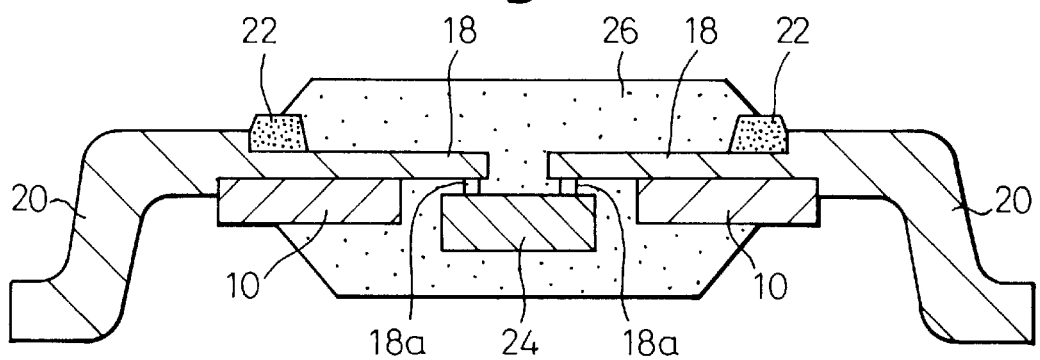
FIGS. 6A–6D are cross-sectional views of some variations of an inner lead-bonding type semiconductor device according to the present invention.
Figure 6B:
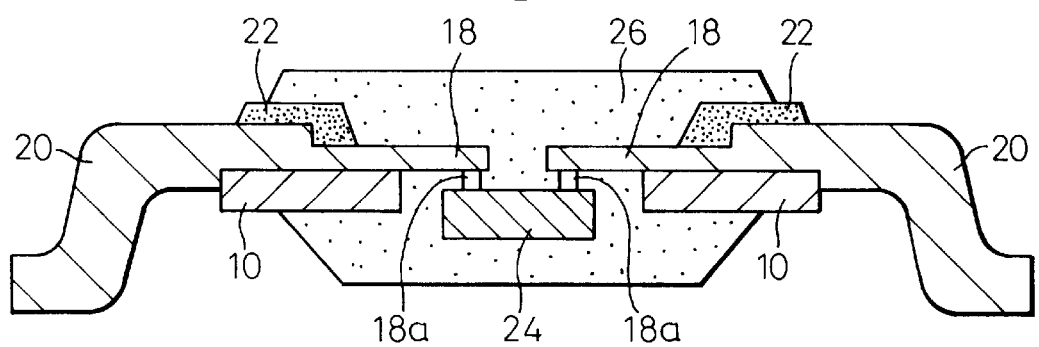
Figure 6C:
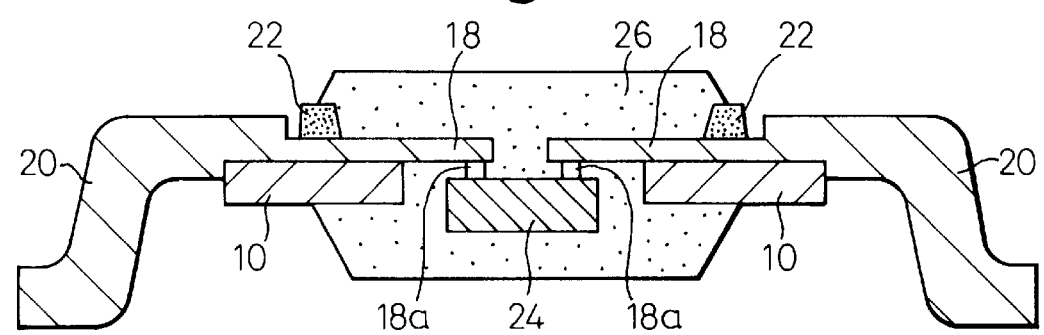
Figure 6D:
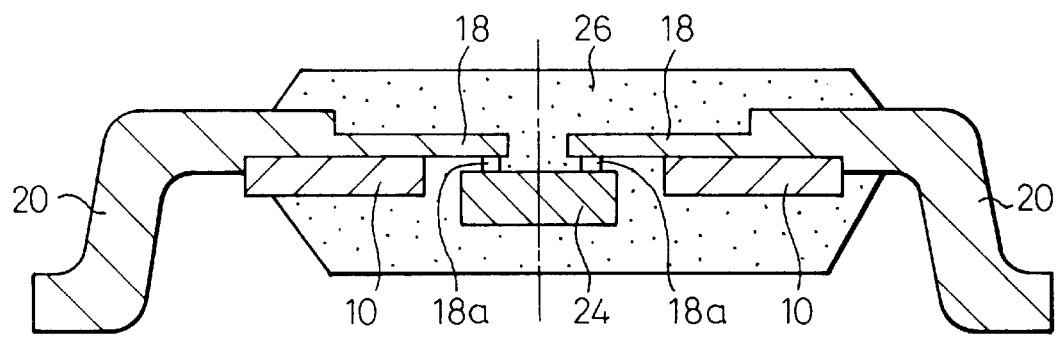

FIGS. 6A–6D are cross-sectional views of some variations of an inner lead bonding-type semiconductor device. In the embodiment of FIG. 6A, the solder resist 22 is coated on the inner leads 18 before the thickness of the outer leads 20 is increased by copper-plating, so that the thick portion of the outer lead 20 extends from the position of the solder resist 22. In the embodiment of FIG. 6B, the solder resist 22 is coated after the thickness of the outer leads 20 is increased by copper-plating, so that the solder resist 22 is formed on the transitional portion between the thick and thin portions. In the embodiment of FIG. 6C, the solder resist 22 may either be coated before or after the thickness of the outer leads 20 is increased by copper-plating. In the embodiment of FIG. 6D, no such solder resist (22) is provided and the semiconductor device is hermetically sealed with a resin, in such a manner that the base film 10 may completely covered with the mold resin 26 as shown in the right half of FIG. 6D or the base film 10 may be partially covered as shown in the left half of FIG. 6D.

In the embodiments of FIGS. 6B and 6D, the portion of the outer lead 20 where the thickness thereof is increased is covered by the mold resin 26. That is to say, only the thick portion of the outer lead 20 is extended outwardly from the mold resin 26. Therefore, the outer leads 20, particularly the base portion of the outer leads 20 where the thickness thereof is changed, can stably be retained by the mold resin 26 and, therefore, the outer leads 20 can be prevented from being easily deformed or bent.

Figure 7:
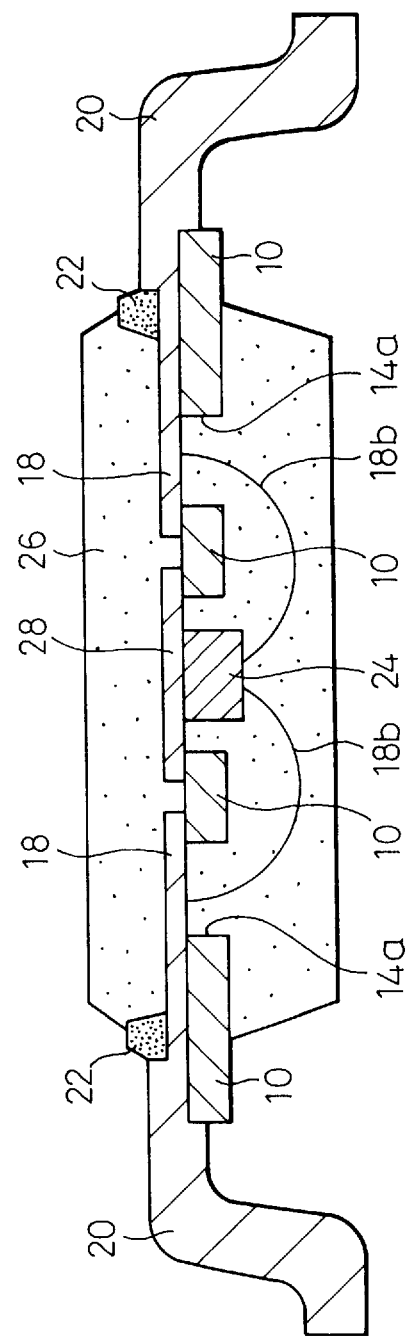
FIG. 7 is a cross-sectional view of an embodiment of a wire-bond type semiconductor device according to the present invention.

FIG. 7 is a cross-sectional view of a wire-bonding type semiconductor device, in which the semiconductor chip 24 is mounted on the lower surface of the die pad 28 and connected to the inner leads 18 by the bonding wires 18b through the second window holes 14a, as mentioned above with reference to FIG. 5C. Regarding the solder resist 22, although FIG. 7 shows an embodiment in which the solder resist 22 is coated on the inner leads 18 before the thickness of the outer leads 20 is increased by a copper-plating, in the same manner as the embodiment of FIG. 6A. However, such a solder resist 22 can be coated after the copper-plating as the embodiment of FIG. 6B, or such a solder resist 22 may either be coated before or after the copper-plating, as the embodiment of FIG. 6C. Also, there may be no such solder resist (22) as the embodiment of FIG. 6D.

Figure 8:
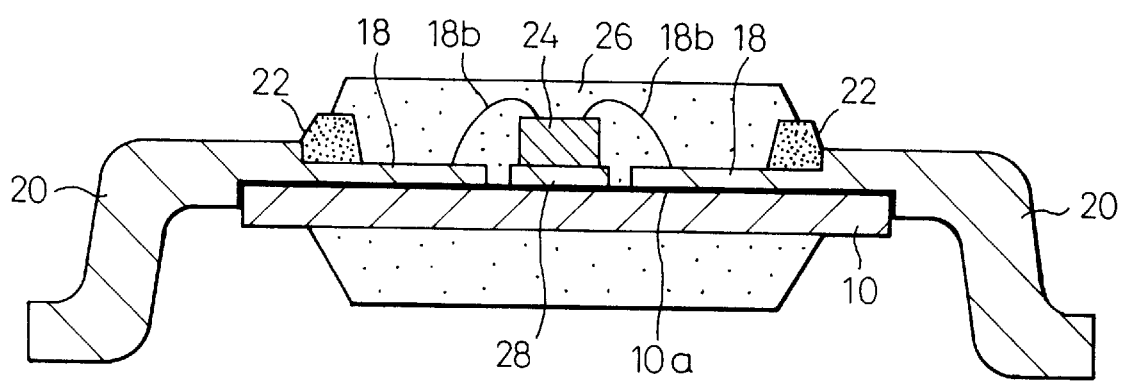
FIG. 8 is a cross-sectional view of another embodiment of a wire-bonding type semiconductor device according to the present invention.
Figure 9A:
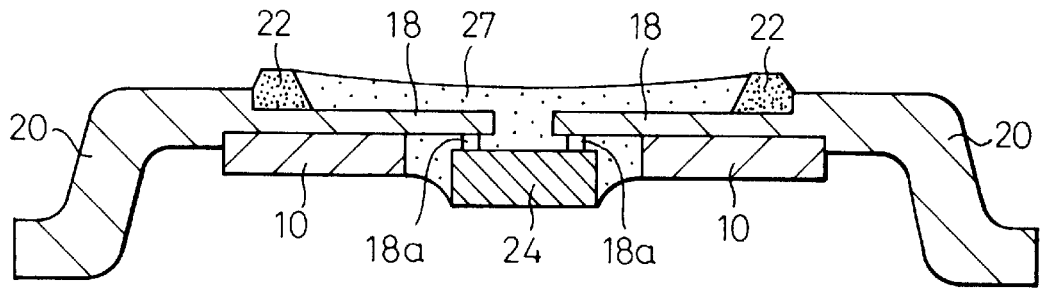
FIGS. 9A–9D are cross-sectional views of some variations of a potted type semiconductor device.
Figure 9B:
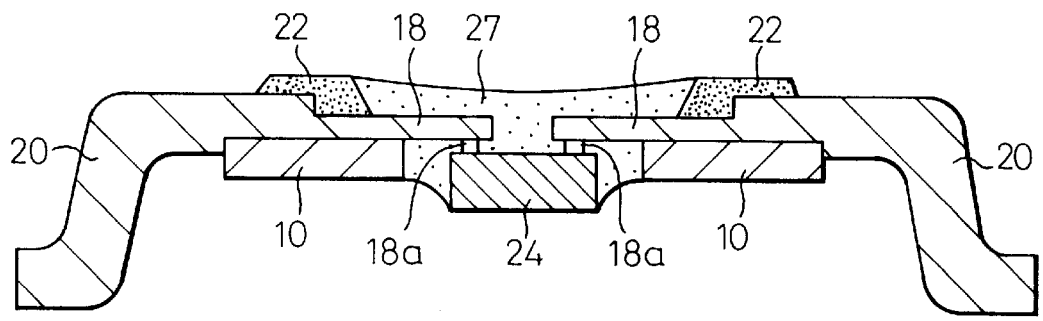
Figure 9C:
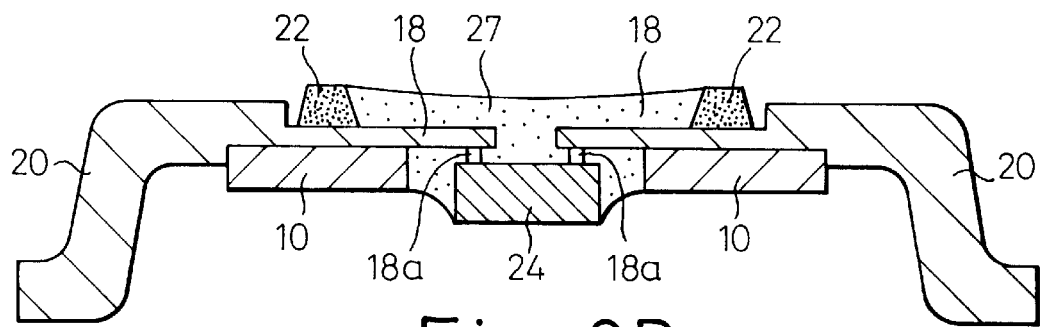
Figure 9D:
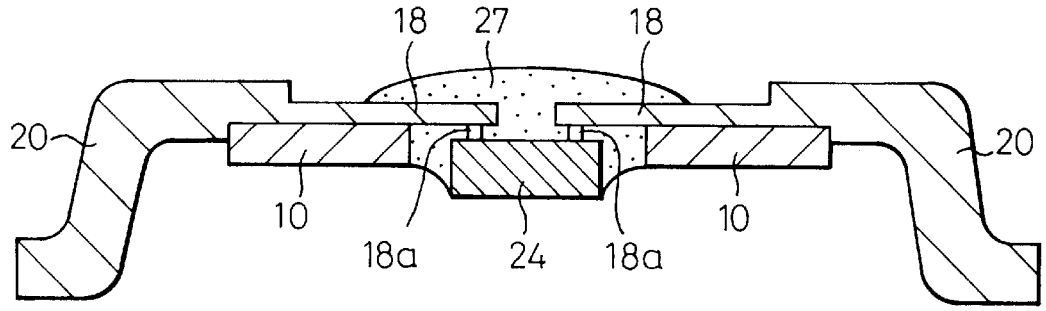

FIG. 8 is a cross-sectional view of another wire-bonding type semiconductor device, in which the semiconductor chip 24 is mounted on the upper surface of the die pad 28 of the TAB tape as shown in FIG. 5B and connected to the inner leads 18 by the bonding wires 18b. Also, in this embodiment, although the solder resist 22 is coated on the inner leads 18 before the copper-plating, in the same manner as the embodiment of FIG. 6A, such a solder resist 22 can be coated after the copper-plating as the embodiment of FIG. 6B, or either before or after the copper-plating as the embodiment of FIG. 6C. Also, there may be no such solder resist (22) as the embodiment of FIG. 6D.

In the embodiment of FIG. 8, if the flexible insulating base film 10, made of such as a polyimide, is replaced by a metal plate, the conductive pattern including the die-pad 28 and inner and outer leads 18 and 22 are formed on the metal plate (10) via an electrically insulation adhesive layer 10a. In this case, the metal plate (10) can also be used as a heat spreader.

FIGS. 9A–9D are cross-sectional views of some variations of a potted type semiconductor device. The embodiments of FIGS. 9A–9D are substantially the same as the embodiments of FIGS. 6A–6D, respectively, except that a resin 27 is provided to cover the semiconductor chip 24 and the inner leads 18 by potting.

Figure 10:
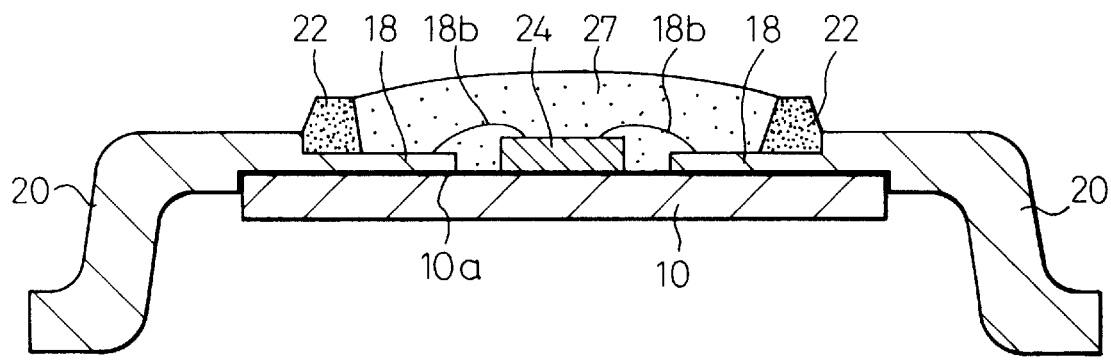
FIG. 10 is a cross-sectional view of another embodiment of a potted type semiconductor device.

FIG. 10 is a cross-sectional view of an embodiment of a wire-bonding type semiconductor device, which is similar to the embodiment of FIG. 8, except that a resin 27 is provided to cover the semiconductor chip 24 and the inner leads 18 by potting. Also, in this embodiment, although the solder resist 22 is coated on the inner leads 18 before the copper-plating, in the same manner as the embodiment of FIG. 8, such a solder resist 22 can be coated after the copper-plating, or either before or after the copper-plating. Also, there may be no such solder resist (22).

In the same manner as embodiment of FIG. 8, if the base film 10 in the embodiment of FIG. 10 is replaced by a metal plate, the conductive pattern including the die-pad 28 and inner and outer leads 18 and 20 are formed on the metal plate (10) via an electrically insulation adhesive layer 10a. In this case, since the metal plate (10) is directly exposed, heat from the semiconductor device can be effectively radiated.

Figure 11:
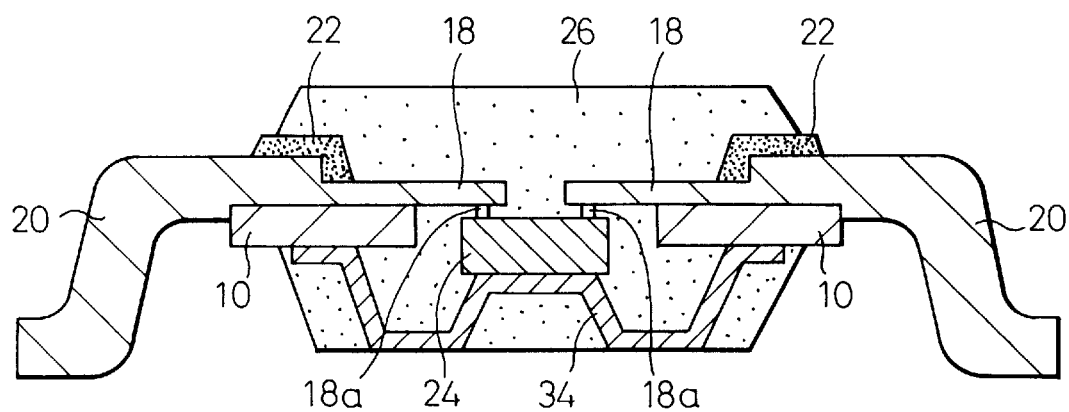
FIG. 11 is a cross-sectional view of an embodiment of an inner lead-bonding type semiconductor device having a heat spreader or heat sink.
Figure 12:
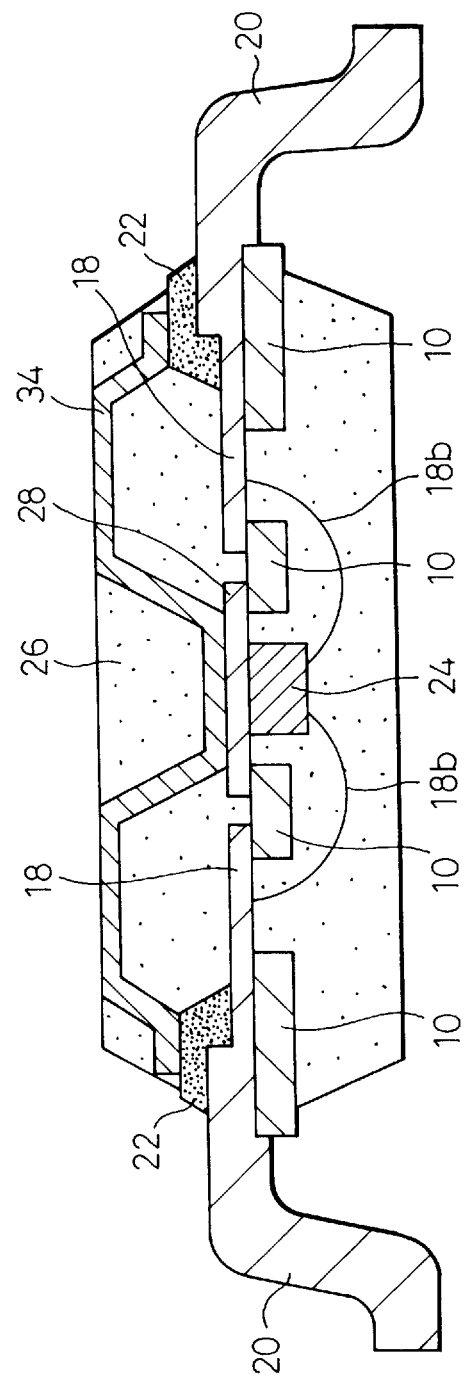
FIG. 12 is a cross-sectional view of an embodiment of a wire-bonding type semiconductor device having a heat spreader.
Figure 13:
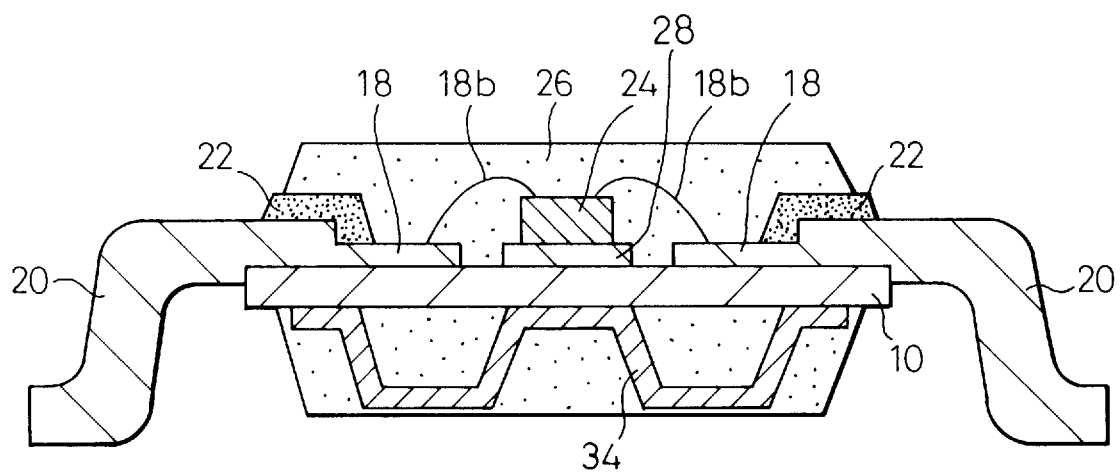
FIG. 13 is a cross-sectional view of another embodiment of a wire-bonding type semiconductor device having a heat spreader.

In FIGS. 11, 12 and 13, some embodiments of a semiconductor device having a heat spreader 34 are shown. The embodiment of FIG. 11 (inner lead-bonding type) is the same as the embodiment of FIG. 6B, except that a heat spreader 34 is disposed for effectively radiating the heat in the semiconductor device. The heat spreader 34 is made of any suitable metal plate having a good thermal conductivity and is shaped such that a central convex portion contacts the semiconductor chip 24, an intermediate bottom portion is exposed to the outside, and a peripheral portion contacts the base film 10.

The embodiment of FIG. 12 (wire-bonding type) is substantially the same as the embodiment of FIG. 7, except for the heat spreader 34. The heat spreader 34 in this embodiment comprises a central convex portion which contacts the die-pad 28 opposite the semiconductor chip 24, an intermediate upper portion exposed to the outside, and a peripheral portion which contacts the solder resist 22.

The embodiment of FIG. 13 (another wire-bonding type) is substantially the same as the embodiment of FIG. 8, except that a heat spreader 34 is disposed in the same manner as the above-mentioned embodiments. The heat spreader 34 in this embodiment comprises a central convex portion which contacts the base film 10 opposite the die-pad 28 and the semiconductor chip 24, an intermediate bottom portion exposed to the outside, and a peripheral portion which also contacts the same base film 10.

In the embodiments of FIGS. 8 and 10, instead of an insulating base film made of polyimide, a metal plate made of copper or 42% copper alloy with an electrically insulating layer on the surface thereof is used as a base film. However, such a base film of metal plate can also be used in the embodiments other than those of FIGS. 8 and 10.

In the embodiments as mentioned above, the lead frame can be made in accordance with a similar process for making a TAB tape, in which a copper foil is first formed on a base insulating film and then a conductive pattern is formed by etching the copper foil. However, the lead frame can also be made in accordance with a process in which a lead pattern is first formed and then the lead pattern is supported by an insulating film. In any case, the lead frame thus made can be used to mount a semiconductor chip thereon and can be handled in the same manner as a conventional lead frame. A semiconductor device product sealed with a resin can also be easily handled. Therefore, in this specification, "lead frame" used for mounting thereon a semiconductor chip is also referred to as "TAB tape".

To increase the thickness of a part of the outer lead 20, the outer leads can be plated partially with copper, as in the embodiments mentioned above. However, in practice, the following methods can be employed, in consideration of the bonding characteristic at the inner lead portions and the mounting characteristic at the outer lead portions. In any case, copper can be used as a base material to increase the thickness of the outer leads.

(1) The inner leads are plated with gold to form protective layers and the outer leads are plated with copper or solder to increase the thickness thereof. In this case, since it is relatively difficult to directly plate with gold, it is preferable that the entire lead surfaces, i.e., including the respective surfaces of the inner and outer leads, are plated with nickel as an underlayer, then all of the leads are plated with a gold layer, and then only the outer lead portions are subjected to plating to further increase the thickness thereof.

In this case, to increase the thickness, the outer leads may be plated with copper, plated with solder after being plated with copper, or plated with solder in place of copper. Thus, in the portions of the outer leads plated with copper or solder, the plated copper or solder layer is exposed to the outside.

(2) Both inner and outer leads are plated with palladium to form protective layers. In this case, in consideration of the bonding characteristic at the inner lead portions and the mounting characteristic at the outer lead portions, all the lead surfaces, i.e., including the respective surfaces of the inner and outer leads, are plated with palladium. It is preferable that the copper foil is plated with nickel as an underlayer, then the outer lead portions are subjected to plating to increase the thickness thereof, and then the entire lead surface including inner and outer leads are plated with palladium. In this case, after the outer lead portions are plated with copper to increase the thickness thereof, solder may further be plated thereon.

(3) Both inner and outer leads are plated with tin to form a protective layer. In this case, since tin can be plated directly on the copper material without an underlayer, only the outer lead portions are first plated with a copper or solder to increase the thickness thereof, and then all the lead surfaces including inner and outer leads are plated with a tin. In this case, the outer lead portions may be first plated with copper and then plated with solder to increase the thickness thereof and then the entire lead surface including inner and outer leads may be plated with tin.

According to this method, since there is no underlayer, the thickness of the inner leads can advantageously be made as thin as possible and, therefore, this method is particularly suitable for making a TAB tape having fine patterns.

In the above-mentioned embodiments, the thickness of the plated layer can advantageously be selected a such a that the thickness of the plated gold is 0.3 to 5 $\mu$m, the thickness of the plated nickel is 1 to 20 $\mu$m, the thickness of the plated palladium is 0.1 to 0.5 $\mu$m, and the thickness of the plated tin is about 0.5 $\mu$m.

The thickness of the plated layer, for increasing the thickness of the outer leads, may be 50 to 70 $\mu$m. Since the base copper material has a thickness of about several tens of $\mu$m, the entire thickness of the outer lead, including the plated underlayer, may thus be about 100 $\mu$m.

Although in the above-mentioned embodiments, the outer leads are subjected to plating to increase the thickness thereof, the thickness of the outer leads 20 may be increased by any other method, such as sputtering or vapor deposition.

It should be understood by those skilled in the art that the foregoing description relates to only preferred embodiment of the disclosed invention, and that various changes and modifications may be made to the invention without departing from the spirit and scope thereof.

As mentioned above, according to the present invention, a useful and improved lead frame and semiconductor devices using the same can thus be provided.

We claim:

1. A lead frame adapted to be used for a semiconductor device, comprising:

a plurality of inner leads made of a layer of metal of a first thickness in a range of about 12 $\mu$m to 70 $\mu$m; and a plurality of outer leads integrally formed with respective said inner leads and of the same metal layer, said outer leads being coated with corresponding metal layers of said same metal to increase a thickness thereof to a second thickness greater than the first thickness and which affords a desired strength of said outer leads, greater than a corresponding strength of said inner leads.

2. A lead frame as set forth in claim 1, wherein all surfaces of said inner leads and said outer leads are plated with a protective metal layer of gold, silver, palladium or tin.

3. A lead frame adapted to be used for a semiconductor device, comprising:

an insulating base film;

a conductive pattern formed on said insulating base film including a plurality of inner leads and a plurality of outer leads integrally formed with respective said inner leads from a common layer of a selected metal of a first thickness in a range of about 12 $\mu$m to 70 $\mu$m; and said outer leads being coated with corresponding layers of the same selected metal to increase a thickness thereof to a second thickness, greater than the first thickness, and so that a desired increased strength of said outer leads, relatively to a strength of said inner leads, thereby is obtained.

4. A lead frame as set forth in claim 3, wherein all surfaces of said inner leads and said outer leads are plated with a protective metal layer of gold, silver, palladium or tin.

5. A lead frame as set forth in claim 3, wherein said insulating base film has a device hole at a central position thereof and window holes at corresponding positions displaced from said central device hole position, each said inner lead extending inwardly into said central device hole and each said outer lead extending outwardly from said inner lead and over a respective said window hole.

6. A lead frame as set forth in claim 3, wherein a die-pad is formed as a part of said conductive pattern formed on said insulating base film at a central position thereof, and said insulating base film has window holes at corresponding positions displaced from said die-pad, each said inner lead extending inwardly toward said die-pad and each said outer lead extending outwardly from said inner lead and over a respective said window hole.

7. A lead frame as set forth in claim 3, wherein said outer leads are continuously connected to each other by a tie bar which comprises a part of said conductive pattern.

8. A semiconductor device comprising:

(a) a lead frame adapted to be used for a semiconductor device, comprising:

a plurality of inner leads made of a layer of metal of a first thickness in a range of about 12 $\mu$m to 70 $\mu$m; and a plurality of outer leads integrally formed with respective said inner leads and of the same metal layer, said outer leads being coated with corresponding metal layers of said same metal to increase the thickness thereof to a second thickness greater than the first thickness and which affords a desired strength of said outer leads, greater than a corresponding strength of said inner leads;

(b) a semiconductor chip electrically connected to said inner leads; and (c) resin material encompassing and hermetically sealing said semiconductor chip and at least said inner leads of said lead frame.

9. A semiconductor device comprising:

(a) a lead frame comprising:

an insulating base film having a device hole at a central position thereof and window holes at corresponding positions displaced from said device hole position, a conductive pattern formed on said insulating base film and comprising a plurality of inner leads and a plurality of outer leads integrally formed with respective said inner leads from a common layer of a selected metal of a first thickness in a range of about 12 $\mu$m to 70 $\mu$m, each said inner lead extending inwardly into said central device hole and each said outer lead extending outwardly from said inner lead and over a respective said window hole, and said outer leads being coated with corresponding layers of the same selected metal to increase a thickness thereof to a second thickness, greater than the first thickness, and so that a desired increased strength of said outer leads, relatively to a strength of said inner leads, thereby is obtained;

(b) a semiconductor chip mounted on and electrically connected to said inner leads within said central opening; and (c) resin material encompassing and hermetically sealing said semiconductor chip and at least said inner leads.

10. A semiconductor device comprising:

(a) a lead frame comprising:

an insulating base film having a device hole at a central position thereof and window holes at positions displaced from the central device hole position, a conductive pattern formed on said insulating base film and comprising a plurality of inner leads and a plurality of outer leads integrally formed with respective said inner leads from a common layer of a selected metal of a first thickness in a range of about 12 $\mu$m to 70 $\mu$m, each said inner lead extending inwardly toward said die-pad and each said outer lead extending outwardly from said inner lead and over a respective said window hole, and said outer leads being coated with corresponding layers of the same selected metal to increase a thickness thereof to a second thickness, greater than the first thickness, and so that a desired increased strength of said outer leads, relatively to a strength of said inner leads, thereby is obtained;

(b) a semiconductor chip mounted on said die-pad;

(c) bonding wires electrically connecting said semiconductor chip to said inner leads; and (d) resin material encompassing and hermetically sealing said semiconductor chip and at least said inner leads.

11. A semiconductor device lead frame, comprising:

a plurality of respectively related and integral inner and outer leads made of a common layer of a selected metal of a first thickness in a range of about 12 $\mu$m to 70 $\mu$m and having opposed main surfaces; and a metal layer coated on a selected one of the first and second main surfaces of the outer leads of the same selected metal and forming a composite thickness therewith which is greater than the first thickness and affords a desired strength to the outer leads which is greater than a corresponding strength of the inner leads.

12. A lead frame as set forth in claim 11, wherein all the surfaces of said inner leads and said outer leads are plated with a protective metal layer of gold, silver, palladium or tin.

13. A lead frame adapted to be used for a semiconductor device, comprising:

an insulating base film; and a conductive pattern formed on said insulating base film and comprising:

a plurality of respectively related and integral inner and outer leads made of a common layer of a selected metal of a first thickness in a range of about 12 $\mu$m to 70 $\mu$m and having opposed main surfaces, and a layer of the same selected metal coated on a selected one of the first and second main surfaces of the outer leads and forming a composite thickness therewith which is greater than the first thickness and affords a desired strength to the outer leads which is greater than a corresponding strength of the inner leads.

14. A lead frame as set forth in claim 13, wherein all the surfaces of said inner leads and said outer leads are plated with a protective metal layer of gold, silver, palladium or tin.

15. A lead frame comprising:

an insulator having a surface;

conductive inner leads on the surface of said insulator and having a first thickness;

conductive outer leads integrally formed with respective said conductive inner leads on the surface of said insulator and having a second thickness greater than the first thickness; and a solder resist on the surface of said insulator so as to fill gaps between said conductive inner leads.

\* \* \* \* \*

UNITED STATES PATENT AND TRADEMARK OFFICE
CERTIFICATE OF CORRECTION

PATENT NO. : 5,859,471
DATED : January 12, 1999
INVENTOR(S) : Fumio Kuraishi, et. al.

It is certified that error appears in the above-identified patent and that said Letters Patent is hereby corrected as shown below:

On the title page, [63] Related U.S. Application Data, change "JP03" to --JP93--.

Signed and Sealed this

Fourth Day of April, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO. : 5,859,471
DATED : January 12, 1999
INVENTOR(S) : Fumio Kuraishi et al.

It is certified that error appears in the above-identified patent and that said Letters Patent is hereby corrected as shown below:

On the title page, [63] Related U.S. Application Data, change "JP03" to --JP93--.

Please delete all of the claims (col. 9, line 42 - col. 12, line 35) and substitute therefore the following claims.

1. A. lead frame comprising:
    an insulating base film having a surface;
    a plurality of inner leads on the surface of said insulating base film and made of a layer of metal of a first thickness in a range of about 12μm to 70μm;
    a plurality of outer leads integrally formed with respective said inner leads and of the same metal layer on the surface of said insulating base film, said outer leads being coated with corresponding metal layers to increase a thickness thereof to a second thickness greater thatn the first thickness and which affords a desired strength of said outer leads, greater than a corresponding strength of said inner leads; and
    a solder resist on the surface of said insulating base film so as to fill gaps between said inner leads.

3. A lead frame as set forth in claim 1, wherein all surfaces of said inner leads and said outer leads are plated with a protective metal layer of gold, silver, palladium or tin.

4. A lead frame comprising:
    an insulating base film having a surface;
    a conductive pattern formed on the surface of said insulating base film and including a plurality of inner leads and a plurality of outer leads integrally formed with respective said inner leads from a common layer of a selected metal of a first thickness in a range of about 12 μm to 70 μm;
said outer leads being coated with corresponding layers of metal to increase a thickness thereof to a second thickness, greater than the first thickness, and so that a desired increased strength of said outer leads, relatively to a strength of said inner leads, thereby is obtained; and
    a solder resist on the surface of said insulting base film so as to fill gaps between said inner leads.

UNITED STATES PATENT AND TRADEMARK OFFICE
CERTIFICATE OF CORRECTION

PATENT NO.    : 5,859,471
DATED         : January 12, 1999
INVENTOR(S)   : Fumio Kuraishi et al.

It is certified that error appears in the above-identified patent and that said Letters Patent is hereby corrected as shown below:

6. A lead frame as set forth in claim 4, wherein all surfaces of said inner leads and said outer leads are plated with a protective metal layer of gold, silver, palladium or tin.

7. A lead frame as set forth in claim 4, wherein said insulating base film has a device hole at a central position thereof and window holes at corresponding positions displaced from said central device hole position, each said inner lead extending inwardly into said central device hole and each said outer lead extending outwardly from said inner lead and over a respective said window hole.

8. A lead frame as set forth in claim 4, wherein a die-pad is formed as a part of said conductive pattern formed on said insulating base film at a central position thereof, and said insulating base film has window holes at corresponding positions displaced from said die-pad, each said inner lead extending inwardly toward said die-pad and each said outer lead extending outwardly from said inner lead and over a respective said window hole.

9. A lead frame as set forth in claim 4, wherein said outer leads are continuously connected to each other by a tie bar which comprises a part of said conductive pattern.

15. A semiconductor device comprising:
    (a)    a lead frame comprising:
an insulating base film having a surface;
a plurality of inner leads on the surface of said insulating base film and made of a layer of metal of a first thickness in a range of about $12\mu m$ to $70\mu m$; a plurality of outer leads integrally formed with respective said inner leads and of the same metal layer on the surface of said insulating base film, said outer leads being coated with corresponding metal layers to increase the thickness thereof to a second thickness greater than the first thickness and which affords a desired strength of said outer leads, greater than a corresponding strength of said inner leads; and
a solder resist on the surface of said insulating base film so as to fill gaps between said inner leads;
    (b)    a semiconductor chip electrically connected to said inner leads; and

UNITED STATES PATENT AND TRADEMARK OFFICE
CERTIFICATE OF CORRECTION

PATENT NO. : 5,859,471
DATED : January 12, 1999
INVENTOR(S) : Fumio Kuraishi et al.

It is certified that error appears in the above-identified patent and that said Letters Patent is hereby corrected as shown below:

(c)    resin material encompassing and hermetically sealing said semiconductor chip and at least said inner leads of said lead frame.

16. A semiconductor device comprising:
    (a)    a lead frame comprising:
        an insulating base film having a surface and having a device hole at a central position thereof and window holes at corresponding positions displaced from said device hole position, a conductive pattern formed on the surface of said insulating base film and comprising a plurality of inner leads and a plurality of outer leads integrally formed with respective said inner leads from a common layer of a selected metal of a first thickness in a range of about 12 $\mu$m to 70 $\mu$m, each said inner lead extending inwardly into said central device hole and each said outer lead extending outwardly from said inner lead and over a respective said window hole, and a solder resist on the surface of said insulating base film so as to fill gaps between said inner leads,
        said outer leads being coated with corresponding layers of metal to increase a thickness thereof to a second thickness, greater than the first thickness, and so that a desired increased strength of said outer leads, relatively to a strength of said inner leads, thereby is obtained;
    (b)    a semiconductor chip mounted on and electrically connected to said inner leads within said central opening; and
    (c)    resin material encompassing and hermetically sealing said semiconductor chip and at least said inner leads.

17. A semiconductor device comprising:
    (a)    a lead frame comprising:
        an insulating base film having a surface and having a device hole at a central position thereof and window holes at position displaced from the central device hole position,
        a conductive pattern formed on the first surface of said insulating base film and comprising a plurality of inner leads and a plurality of outer leads integrally formed with respective said inner leads from a common layer of a selected metal of a first thickness in a range of about 12$\mu$m to 70 $\mu$m, each said inner lead

UNITED STATES PATENT AND TRADEMARK OFFICE
CERTIFICATE OF CORRECTION

PATENT NO. : 5,859,471
DATED : January 12, 1999
INVENTOR(S) : Fumio Kuraishi et al.

It is certified that error appears in the above-identified patent and that said Letters Patent is hereby corrected as shown below:

extending inwardly toward said die-pad and each said outer lead extending outwardly from said inner lead and over a respective said window hole, and
a solder resist on the surface of said insulating base film so as to fill gaps between said inner leads;
said outer leads being coated with corresponding layers of metal to increase a thickness thereof to a second thickness, greater than the first thickness, and so that a desired increased strength of said outer leads, relatively to a strength of said inner leads, thereby is obtained;
    (b)    a semiconductor chip mounted on said die-pad;
    (c)    bonding wires electrically connecting said semiconductor chip to said inner leads; and
    (d)    resin material encompassing and hermetically sealing said semiconductor chip and at least said inner leads.

18. A semiconductor device lead frame, comprising:
an insulating base film having a surface;
a plurality of respectively related and integral inner and outer leads on the [first] surface of the insulating base film and made of a common layer of a selected metal of a first thickness in a range of about 12 μm to 70 μm and having opposed main surfaces;

a metal layer coated on a selected one of the first and second main surfaces of the outer leads and forming a compoiste thickness therewith which is greater than the first thickness and affords a desired strength to the outer leads which is greater than a corresponding strength of the inner leads; and
a solder resist on the second surface of said insulating base film so as to fill gaps between said inner leads.

20. A lead frame as set forth in claim 18, wherein all the surfaces of said inner leads and said outer leads are plated with a protective metal layer of gold, silver, palladium or tin.

UNITED STATES PATENT AND TRADEMARK OFFICE
CERTIFICATE OF CORRECTION

PATENT NO.   : 5,859,471
DATED        : January 12, 1999
INVENTOR(S)  : Fumio Kuraishi et al.

It is certified that error appears in the above-identified patent and that said Letters Patent is hereby corrected as shown below:

21. A lead frame comprising:
    an insulating base film having a surface; and
    a conductive pattern formed on the surface of said insulating base film and comprising:
        a plurality of respectively related and integral inner and outer leads made of a common layer of a selected metal of a first thickness in a range of about 12 µm to 70 µm and having opposed main surfaces, and
        a layer of metal coated on a selected one of the first and second main surfaces of the outer leads and forming a composite thickness therewith which is greater than the first thickness and affords a desired strength to the outer leads which is greater than a corresponding strength of the inner leads; and a solder resist on the surface of said insulating base film so as to fill gaps between said inner leads.

23. A lead frame as set forth in claim 21, wherein all the surfaces of said inner leads and said outer leads are plated with a protective metal layer of gold, silver, palladium or tin.

UNITED STATES PATENT AND TRADEMARK OFFICE
CERTIFICATE OF CORRECTION

PATENT NO. : 5,859,471
DATED : January 12, 1999
INVENTOR(S) : Fumio Kuraishi et al.

It is certified that error appears in the above-identified patent and that said Letters Patent is hereby corrected as shown below:

24. A lead frame comprising:
  an insulator having a surface;
  conductive inner leads on the surface of said insulator and having a first thickness;
  conductive outer leads integrally formed with respective said conductive inner leads on the surface of said insulator and having a second thickness greater than the first thickness; and
  a solder resist on the surface of said insulator so as to fill gaps between said conductive inner leads.

Signed and Sealed this

Third Day of July, 2001

*Nicholas P. Godici*

*Attest:*

*Attesting Officer*

NICHOLAS P. GODICI
*Acting Director of the United States Patent and Trademark Office*